(12) United States Patent
Moschiano et al.

(10) Patent No.: US 9,779,826 B1
(45) Date of Patent: Oct. 3, 2017

(54) MEMORY DEVICES FOR READING MEMORY CELLS OF DIFFERENT MEMORY PLANES

(71) Applicant: MICRON TECHNOLOGY, INC., Boise, ID (US)

(72) Inventors: Violante Moschiano, Avezzano (IT); Mattia Cichocki, Rome (IT); Tommaso Vali, Sezze (IT); Maria-Luisa Gallese, Avezzano (IT); Umberto Siciliani, Rubano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/657,451

(22) Filed: Jul. 24, 2017

Related U.S. Application Data

(62) Division of application No. 15/288,010, filed on Oct. 7, 2016, which is a division of application No. 14/479,950, filed on Sep. 8, 2014, now Pat. No. 9,502,125.

(51) Int. Cl.
| | |
|---|---|
| *G11C 11/34* | (2006.01) |
| *G11C 16/26* | (2006.01) |
| *G11C 11/56* | (2006.01) |
| *G11C 8/06* | (2006.01) |
| *G11C 8/12* | (2006.01) |
| *G11C 16/32* | (2006.01) |

(52) U.S. Cl.
CPC ............... *G11C 16/26* (2013.01); *G11C 8/06* (2013.01); *G11C 8/12* (2013.01); *G11C 11/5642* (2013.01); *G11C 16/32* (2013.01)

(58) Field of Classification Search
CPC ....... G11C 16/26; G11C 11/5642; G11C 8/06; G11C 8/12
USPC ............... 365/185.12, 185.11, 230.03, 238.5
See application file for complete search history.

(56) References Cited

U.S. PATENT DOCUMENTS

| | | | |
|---|---|---|---|
| 4,803,655 A | 2/1989 | Flora | |
| 5,276,856 A | 1/1994 | Norsworthy | |
| 5,732,017 A | 3/1998 | Schumann | |
| 8,559,225 B2 | 10/2013 | Lee | |
| 8,972,650 B2 | 3/2015 | Post | |
| 9,070,470 B1 | 6/2015 | Sakui | |
| 9,229,854 B1 | 1/2016 | Kuzmin | |
| 9,432,298 B1 * | 8/2016 | Smith | ................. H04L 49/9057 |
| 9,502,125 B2 * | 11/2016 | Wolf | ..................... G11C 16/26 |
| 2012/0216094 A1 | 8/2012 | Yoo | |

(Continued)

OTHER PUBLICATIONS

K. Sakui; "Sensing Memory Cells Coupled to Different Access Lines in Different Blocks of Memory Cells"; U.S. Appl. No. 14/102,587, filed Dec. 11, 2013; 84 pgs.

*Primary Examiner* — Viet Q Nguyen
(74) *Attorney, Agent, or Firm* — Dicke, Billig & Czaja, PLLC

(57) ABSTRACT

Memory devices may include digital-to-analog converters configured to convert digital values to analog read voltages and to apply the analog read voltages to memory cells in different memory planes, and multiplexers to selectively couple a corresponding table to a page buffer for output of a code from an identified code-containing row of the corresponding tables for each of the different memory planes, with each code corresponding to a data state of one of the memory cells.

21 Claims, 6 Drawing Sheets

(56) References Cited

U.S. PATENT DOCUMENTS

| | | |
|---|---|---|
| 2013/0051141 A1 | 2/2013 | Moschiano et al. |
| 2013/0058164 A1 | 3/2013 | Moschiano et al. |
| 2013/0238875 A1 | 9/2013 | Ramaraju |
| 2013/0346671 A1 | 12/2013 | Michael |
| 2014/0089568 A1 | 3/2014 | Chung |
| 2016/0071605 A1* | 3/2016 | Moschiano ............ G11C 16/26 365/185.12 |
| 2017/0025181 A1* | 1/2017 | Moschiano ............ G11C 16/26 |

* cited by examiner

MEMORY DEVICES FOR READING MEMORY CELLS OF DIFFERENT MEMORY PLANES

RELATED APPLICATION

This is a divisional of U.S. application Ser. No. 15/288,010, filed Oct. 7, 2016, which is a divisional of U.S. application Ser. No. 14/479,950, filed Sep. 8, 2014, now U.S. Pat. No. 9,502,125 issued Nov. 22, 2016, which applications are commonly assigned and incorporated in their entirety herein by reference.

FIELD

The present disclosure relates generally to reading memory cells, and, in particular, the present disclosure relates to concurrently reading first and second pages of memory cells having different page addresses.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cells. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series between a pair of select transistors, e.g., a source select transistor and a drain select transistor. Each source select transistor is connected to a source, while each drain select transistor is connected to a data line, such as column bit line. A "column" may refer to memory cells that are commonly coupled to a local data line, such as a local bit line. It does not require any particular orientation or linear relationship, but instead refers to the logical relationship between memory cell and data line. Note, for example, that for an array having a plurality of memory blocks, a string of memory cells of each memory block might be selectively coupled to a common data line through a drain select transistor.

Some memory devices, such as solid state drives, might be sector-based. In some sector-based devices, individual sectors of data, e.g., that may be referred to as "chunks" of data, such as four kilobyte chunks, might be read from individually addressable portions (e.g., sectors) that are distributed (e.g., randomly distributed) throughout a memory array. For example, a plurality of individually addressable sectors randomly distributed throughout a memory array might be read in a certain read time. Such a read operation, for example, might be referred to as random access read.

However, some NAND memory devices might be page-based, where all the data read in a certain read time might belong to the same page of data specified by the user, using a logical page address. For example, a page of data might be larger than a sector of data. A desired sector of data may then be extracted from the page of data. Moreover, it might be unlikely that more than an individually addressed sector of data would be found in the same page. Therefore, a page read might result in only one addressed sector of data being read in a certain read time instead of plurality of addressed sectors of data.

For the reasons stated above, and for other reasons stated below which will become apparent to those skilled in the art upon reading and understanding the present specification, there is a need in the art for alternatives to existing methods of reading pages of data.

DETAILED DESCRIPTION

Figure 1:
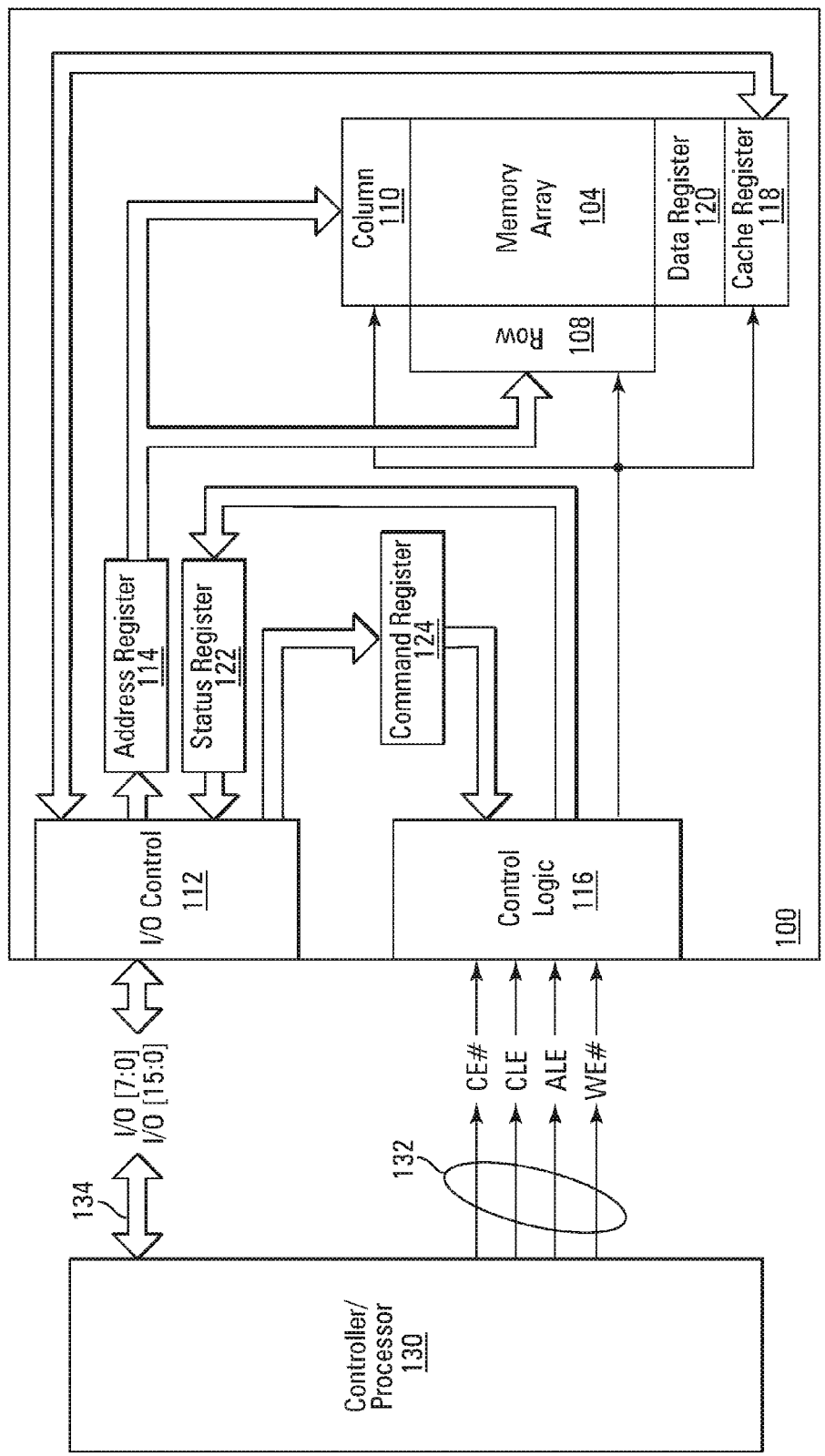
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 is a simplified block diagram of an electronic device, e.g., an integrated circuit device, such a memory device 100, in communication with a controller 130, such as a memory controller, e.g. a host controller, as part of an electronic system, according to an embodiment. Memory device 100 might be a NAND flash memory device, for example.

Controller 130 might include a processor, for example. Controller 130 might be coupled to host, for example, and may receive command signals (or commands), address signals (or addresses), and data signals (or data) from the host and may output data to the host.

Memory device 100 includes an array of memory cells 104. Memory array 104 may be what is often referred to as a two-dimensional array, where the memory cells might be in a single physical (e.g., vertical) plane, or a stacked memory array, e.g., what is often referred to as a three-dimensional memory array, where memory cells might be in different physical (e.g., vertical) planes. The term "vertical" may be defined, for example, as a direction that is perpendicular to a base structure, such as a surface of an integrated circuit die. It should be recognized the term vertical takes into account variations from "exactly" vertical due to routine manufacturing and/or assembly variations and that one of ordinary skill in the art would know what is meant by the term vertical.

Memory array 104 might include a plurality of memory planes that might include one or more blocks of memory cells, such as memory blocks. For example, the different planes might not necessarily be different physical planes in a stacked memory array.

A row decoder 108 and a column decoder 110 might be provided to decode address signals. Address signals are received and decoded to access memory array 104.

Memory device 100 might also include input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116, to latch incoming commands. Control logic 116 controls access to the memory array 104 in response to the commands and generates status information for the external controller 130. The control logic 116 is in communication with row decoder 108 and column decoder 110 to control the row decoder 108 and column decoder 110 in response to the addresses.

Control logic 116 can be included in controller 130. Controller 130 can include, other circuitry, firmware, software, or the like, whether alone or in combination. Controller 130 can be an external controller (e.g., in a separate die from the memory array 104, whether wholly or in part) or an internal controller (e.g., included in a same die as the memory array 104).

Controller 130 may be configured to cause memory device 100 to perform the methods disclosed herein. For example, controller 130 might be configured to cause a first page of memory cells in a first memory plane of a memory array to be read and to cause a second page of memory cells in a second memory plane of the same memory array to be read concurrently with the first page of memory cells. The second page of memory cells might have a different page address than the first page of memory cells, and the second memory plane might be different than the first memory plane.

As used herein, multiple acts being performed concurrently will mean that each of these acts is performed for a respective time period, and each of these respective time periods overlaps, in part or in whole, with each of the remaining respective time periods. In other words, those acts are concurrently performed for at least some period of time. As used herein, multiple acts being performed concurrently will mean that each of these acts is performed for a respective time period, e.g., read time tR, and each of these respective time periods overlaps, in part or in whole, with each of the remaining respective time periods. In other words, those acts are concurrently performed for at least some period of time.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120, e.g., that might include a page buffer, for transfer to the memory array 104; then new data is latched in the cache register 118 from the I/O control circuitry 112. During a read operation, data is passed from the cache register 118 to the I/O control circuitry 112 for output to controller 130 and subsequent output to a host; then new data is passed from the data register 120 to the cache register 118. A status register 122 is in communication with I/O control circuitry 112 and control logic 116 to latch the status information for output to the controller 130.

Memory device 100 receives control signals at control logic 116 from controller 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from controller 130 over a multiplexed input/output (I/O) bus 134 and outputs data to controller 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
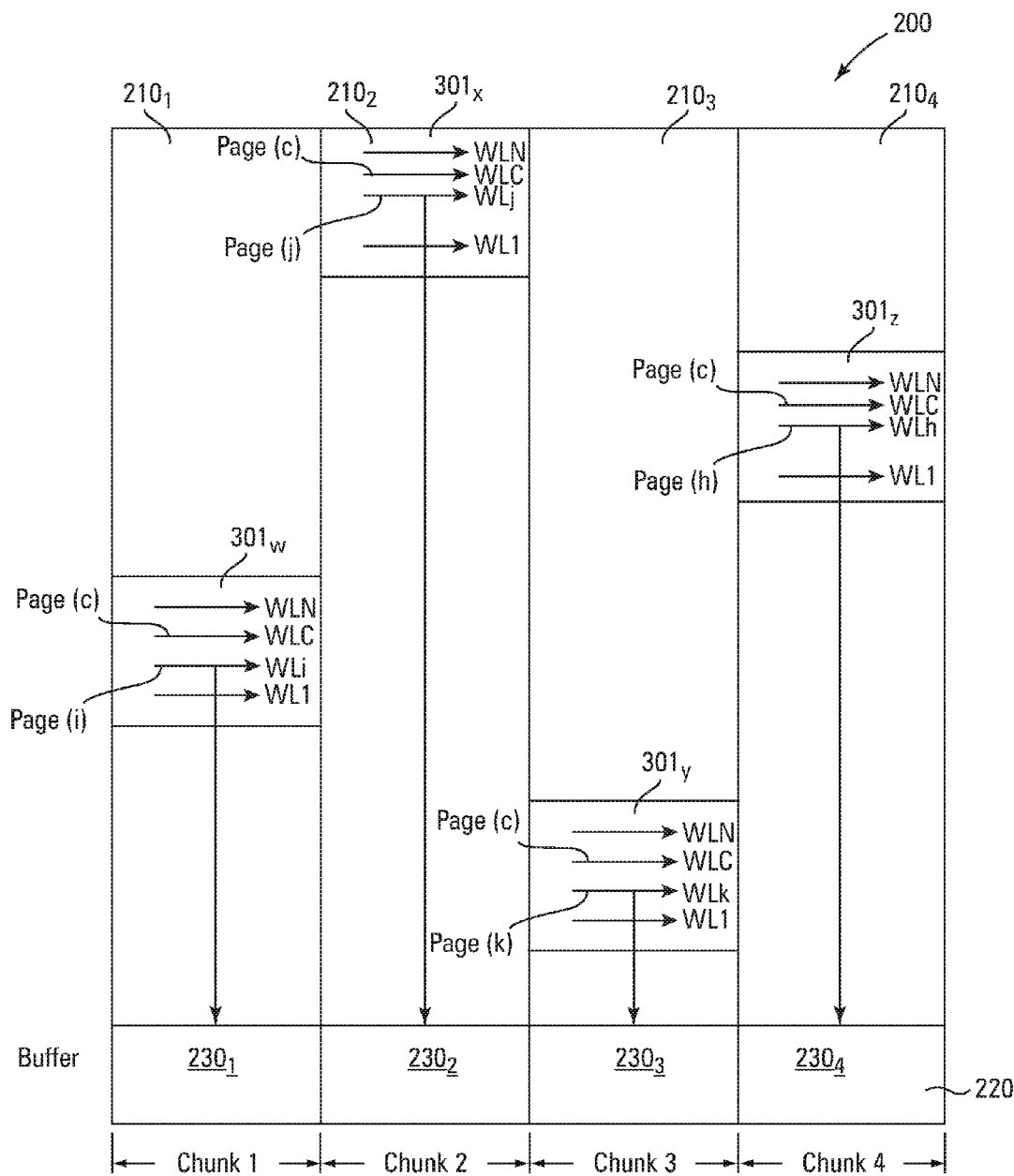
FIG. 2 is a block diagram illustrating a memory array during a read operation, according to another embodiment.

FIG. 2 is a block diagram illustrating a memory array 200, during a read operation. Memory array 200 may be a portion of the memory array 104 of the memory device 100 in FIG. 1. Memory array 200 may have a plurality of memory planes (e.g., that are not necessarily different physical planes in a stacked memory array), e.g., including memory planes $210_1$ to $210_4$, that might be accessed (e.g., read) in parallel concurrently.

Figure 3:
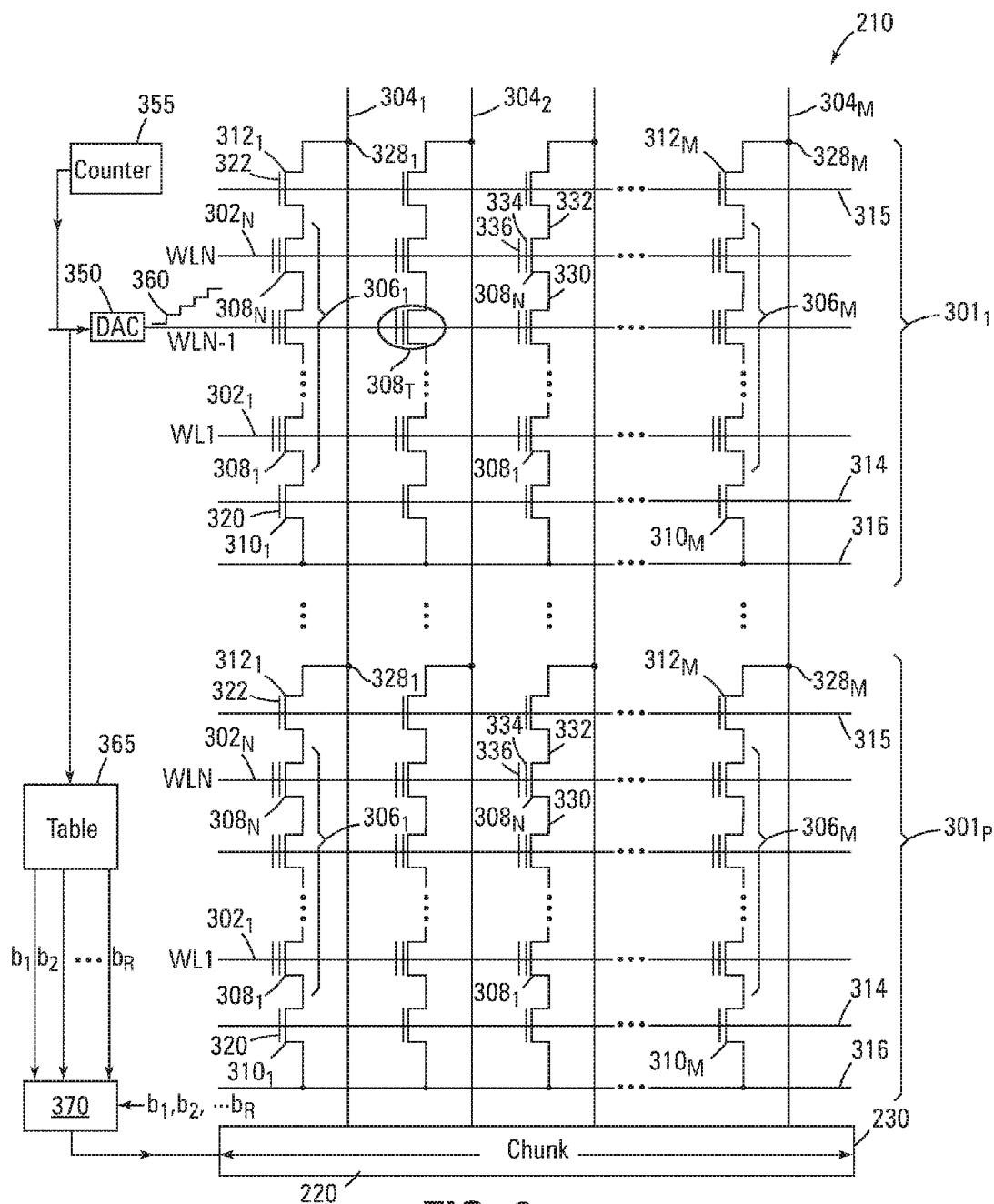
FIG. 3 is a schematic diagram of a memory plane, including block representations of components used while reading the memory plane, according to another embodiment.

FIG. 3 is a schematic diagram of a memory plane 210. For example, each of memory planes $210_1$ to $210_4$ may be configured as memory plane 210 in FIG. 3. Each of memory planes $210_1$ to $210_4$ may have a plurality of memory blocks 301 (e.g., NAND memory blocks), such as memory blocks $301_1$ to $301_P$.

Each memory block 301 includes access lines, such as word lines $302_1$ (WL1) to $302_N$ (WLN). Data lines, such as bit lines $304_1$ to $304_M$, may be common to blocks $301_1$ to $301_P$ in a respective memory plane.

Memory blocks 301 may be arranged in rows (each corresponding to a word line 302) and columns (each corresponding to a data line, such as a bit line 304). In a block 301, each column may include a string of series-coupled memory cells, such as one of (e.g., NAND) strings $306_1$ to $306_M$. The memory cells 308 of each string 306 are connected in series, source to drain, between a source select transistor 310, such as a respective one of source select transistors $310_1$ to $310_M$, and a drain select transistor 312, such as a respective one of source select transistors $312_1$ to $312_M$. Each string 306 in a memory block 301 may be selectively coupled to a common source 316, for example, for that memory block 301 by a select transistor 310 and may include memory cells $308_1$ to $308_N$. The memory cells 308 may be non-volatile memory cells for storage of data.

In a memory block 301, a source of each source select transistor 310 may be connected to the source 316, e.g., for that memory block 301, and the drain of each source select transistor 310 may be connected to the source of a memory cell $308_1$ of the corresponding string 306. For example, the drain of source select transistor $310_1$ may be connected to the source of memory cell $308_1$ of the corresponding string $306_1$. A control gate 320 of each source select transistor 310 may be connected to source select line 314.

In each memory block 301, the drain of each drain select transistor 312 may be connected to the bit line 304 for the corresponding string at a drain contact 328, such as a respective one of drain contacts $328_1$ to $328_M$. For example, the drain of a drain select transistor $312_1$ in each block 301 may be connected to the bit line $304_1$ for the corresponding string $306_1$ at drain contact $328_1$. The source of each drain select transistor 312 may be connected to the drain of a memory cell $308_N$ of the corresponding string 306. For example, the source of a drain select transistor $312_1$ in each memory block 301 may be connected to the drain of memory cell $308_N$ of the corresponding string $306_1$ in each memory block. Therefore, each drain select transistor 312 in each memory block 301 selectively couples a corresponding string 306 to a corresponding bit line 304. A control gate 322 of each drain select transistor 312 may be connected to drain select line 315.

Typical construction of memory cells 308 includes a source 330 and a drain 332, a charge-storage structure 334 (e.g., a floating gate, charge trap, etc.) that can store a charge that determines a data value of the memory cell, and a control gate 336, as shown in FIG. 3. Memory cells 308 might have their control gates 336 coupled to (and in some cases form) a word line 302.

For some embodiments, the memory cells 308 commonly coupled to a word line 302 might be referred to as a row of memory cells, while those memory cells coupled to a bit line 304 might be referred to as a column of memory cells. A row of memory cells 308 can, but need not, include all memory cells 308 commonly coupled to a word line 302.

Rows of memory cells 308 often include every other memory cell 308 commonly coupled to a given word line 302. For example, memory cells 308 commonly coupled to a word line 302 and selectively coupled to even bit lines 304 may be a row of memory cells 308, while memory cells 308 commonly coupled to that word line 302 and selectively coupled to odd bit lines 304 may be another row of memory cells 308. Other groupings of memory cells 308 commonly coupled to a word line 302 may also define a row of memory cells 308. For certain memory devices, all memory cells commonly coupled to a given word line might be deemed a physical row, while those portions of the physical row that are read during a single read operation or programmed during a single program operation (e.g., even or odd memory cells) might be deemed a logical row, sometimes referred to as a page.

Memory cells $308_1$ to $308_N$ might be programmed as multiple-level memory cells. For example, memory cells $308_1$ and memory cells $308_N$ respectively commonly coupled to word lines WL1 and WLN might be referred to as edge (e.g., end) memory cells in that they are located at the ends of a string. For some embodiments, edge memory cells may be programmed to have two-bits (e.g., two-bit memory cells), and the memory cells between memory cells $308_1$ and $308_N$ respectively commonly coupled to word lines between word lines WL1 and WLN might be programmed to have three bits per memory cell (e.g., three-bit memory cells). The edge memory cells might be more susceptible to errors during reading and programming, and programming the edge memory cells as two-bit memory cells can help to reduce such errors compared to when a higher number of bits, e.g., three bits, are programmed into these memory cells.

In FIG. 2, data is being read from different memory planes 210, such as from each of memory planes $210_1$ to $210_4$. The data might be output to a page buffer 220, e.g., that may be a portion of data register 120 in FIG. 1. For example, data may be respectively output from data memory planes $210_1$ to $210_4$ to portions $230_1$ to $230_4$ of page buffer 220, as shown in FIG. 2. Note that FIG. 3 illustrates that a portion 230 of a page buffer 220 may be coupled to the bit lines 304 in a memory plane 210. For some embodiments, portions $230_1$ to $230_4$ might be respectively referred to as page buffers $230_1$ to $230_4$. The page buffers $230_1$ to $230_4$ might be respectively dedicated to memory planes $210_1$ to $210_4$. For example, page buffer $230_1$ might only be used for memory plane $210_1$, page buffer $230_2$ only for memory plane $210_2$, page buffer $230_3$ only for memory plane $210_3$, and page buffer $230_4$ only for memory plane $210_4$.

Note that each of memory planes $210_1$ to $210_4$ might have memory blocks $301_1$ to $301_P$, as shown in FIG. 3 for a memory plane 210. The respective memory blocks 301 in each memory plane may have a common memory block number, (e.g., memory block address), but a different memory plane number (e.g., address), for example. Memory planes $210_1$ to $210_4$ might be independently and individually addressed concurrently and might respectively have different addresses. That is, memory planes $210_1$ to $210_4$ might be selected concurrently, for example.

Each memory block might have word lines WL1 to WLN. For example, the memory cells commonly coupled to a word line that are read during a read operation or programmed during a programming operation might be referred to as a page of memory cells that might store a page of data. The word lines in each memory block 301 in each memory plane 210 may be commonly numbered, for example. For example, each memory block 301 in each memory plane 210 might have a word line WL1 having the same word-line number to a word line WLN having the same word-line number.

A particular word line, such as word line WL1, in the respective memory planes $210_1$ to $210_4$ might have a memory plane number according its respective memory plane, and a block number according to its respective block. For example, word lines WL1 in memory planes $210_1$ to $210_4$ might have different memory plane numbers, a same or a different memory block number, and a common word line number. Note, for example, that commonly numbered word lines in different memory planes and/or different memory blocks might not be the same physical entity, might be separated from each other, and might be coupled to different access circuitry.

The memory cells coupled to commonly numbered word lines, such as word lines WLC (FIG. 2), in different memory planes that are read during a single read operation may constitute a page of memory cells storing a page of data. For example, the memory cells coupled to word line WLC in block $301_w$ in plane $210_1$, word line WLC in block $301_x$ in plane $210_2$, word line WLC in block $301_y$ in plane $210_3$, and word line WLC in block $301_z$ in plane $210_4$ that are read during a single read operation, e.g., in a read time tR, might constitute a page of memory cells that store a page of data, such as page(c) of data, as shown in FIG. 2. For example, a target memory cell coupled to word line WLC in block $301_w$ in plane $210_1$, a target memory cell coupled to word line WLC in block $301_x$ in plane $210_2$, a target memory cell coupled to word line WLC in block $301_y$ in plane $210_3$, and a target memory cell coupled to word line WLC in block $301_z$ in plane $210_4$ that are read during a single read operation, e.g., in the read time tR, might constitute a page of target memory cells. The read time tR as defined herein may denote a period of time during which memory cells in planes $210_1$ to $210_4$ may be read concurrently.

Some memory devices, such as NAND memory devices, may be page-based. For example, data may be read to page buffer 220 in response to a user specifying a particular page number, such as the page number that addresses the page(c) of data, and thus the memory cells coupled to word line WLC in block $301_w$ in plane $210_1$, word line word line WLC in block $301_x$ in plane $210_2$, word line WLC in block $301_y$ in plane $210_3$, and word line WLC in block $301_z$ in plane $210_4$. That is, for example, data from planes $210_1$ to $210_4$ are respectively read into portions $230_1$ to $230_4$ of page buffer 220, and this data constitutes the page(c) of data.

Some solid-state storage devices, such as solid-state drives, may be sector-based devices that read multiple sectors of data, e.g., that may be referred to as data "chunks," such as four kilobyte chunks, in a single read operation during a read time tR, from addressable portions (e.g., sectors) that are distributed (e.g., randomly distributed) throughout a memory array. For example, each data chunk may be read from a different data plane. In some instances, these data chunks may be smaller than a page of data, such as the page(c) of data, that may be read in a page-based device in a single read operation during the read time tR. That is, a single data chunk may be retrieved from the page of data (e.g., the page(c) of data), for example. As such, a single data chunk may be read in the read time tR instead of multiple data chunks, as may be desirable for some sector-based devices.

Moreover, even if the memory planes in a page-based device are sized to correspond to a data chunk of a sector-based device, and multiple data chunks are read during a page read in a read time tR, some page-based devices might read only word lines in the respective memory planes corresponding to the addressed page, and thus the data chunks might all belong to the same page of data, such as the page(c) of data. However, it is unlikely that these data chunks will include the desired data chunks that are to be distributed (e.g., randomly distributed) throughout a memory array. For example, some of the desired data chunks might belong to pages other than the addressed page(c) of data.

For some embodiments, a memory device, such as memory device 100 in FIG. 1, may be configured to address different pages concurrently, where each of the different pages might be located in respective ones of planes $210_1$ to $210_N$. In the example of FIG. 2, page(i) in block $301_w$ of plane $210_1$, page(j) in block $301_x$ of plane $210_2$, page(k) in block $301_y$ of plane $210_3$, and page(h) in block $301_z$ of plane $210_4$ might be individually and independently addressed concurrently.

Page(i), page(j), page(k), and page(h) might respectively have different addresses. For example, page(i), page(j), page(k), and page(h) might respectively have different plane addresses. Page(i), page(j), page(k), and page(h) might also respectively have a different page address within a particular memory block of their respective planes, and page(i), page(j), page(k), and page(h) may or may not have a different block address within their respective planes. For example, a location of a page may be specified by plane, a block within the plane, and a location within the block.

Data from page(i), page(j), page(k), and page(h) might be respectively read into portions $230_1$, $230_2$, $230_3$, and $230_4$ of page buffer 220 concurrently, where the data from page(i), page(j), page(k), and page(h) might be respectively referred to as chunk 1, chunk 2, chunk 3, and chunk 4. Data from page(i), page(j), page(k), and page(h) might be respectively stored in memory cells coupled to word lines WLi, WLj, WLk, and WLh, as shown in FIG. 2. For example, data from page(i), page(j), page(k), and page(h) might be respectively stored in target memory cells respectively coupled to word lines WLi, WLj, WLk, and WLh.

Word lines WLi, WLj, WLk, and WLh might be individually and independently addressed concurrently and might respectively have different addresses. Word lines WLi, WLj, WLk, and WLh might respectively have different plane addresses, for example. For example, word lines WLi, WLj, WLk, and WLh may have a different page address within a particular memory block of their respective planes, and word lines WLi, WLj, WLk, and WLh may or may not have a different block address within their respective planes. That is, for example, word lines WLi, WLj, WLk, and WLh might be respectively concurrently addressed by different page addresses, for example.

A location of a word line may be specified by plane, a block within the plane, and a location within the block, for example. Word lines WLi, WLj, WLk, and WLh might be respectively in different locations within their respective memory blocks $301_w$, $301_x$, $301_y$, and $301_z$, for example.

The data chunks might respectively correspond to sectors of data in a sector-based device, for example. Page(i), page(j), page(k), and page(h) might be respectively read into portions $230_1$, $230_2$, $230_3$, and $230_4$ of page buffer 220 concurrently in a single read operation in a read time tR. For example, target memory cells respectively coupled to word lines WLi, WLj, WLk, and WLh might be sensed concurrently, e.g., during the read time tR, and codes respectively corresponding to sensed data states of the target memory cells respectively coupled to word lines WLi, WLj, WLk, and WLh might be respectively output to portions $230_1$, $230_2$, $230_3$, and $230_4$ concurrently.

In the example of FIG. 3, during a read operation, a digital-to-analog converter (DAC) 350, coupled to a word line, such as word line WLN-1 of block $301_1$, might receive a digital input, such as a count from a counter 355. For example, a target memory cell $308_T$ coupled word line WLN-1 might be read. For example, DAC 350 might receive an incremented count and might generate (may output) an analog voltage ramp 360, such as a ramp of analog read voltages, that is applied to word line WLN-1 commonly coupled to one or more memory cells (e.g., target memory cell $308_T$) that are to be read. Each value of the count might correspond to (e.g., represent) a respective one of the analog voltages of analog voltage ramp 360, for example. That is, a value of the count might be a digital representation of a respective one of the analog voltages in analog voltage ramp 360, for example.

The analog voltage ramp 360 might go from its initial voltage to its final voltage in the read time tR. That is, analog voltage ramp 360 might be generated and output in the read time tR, for example.

During each step of analog voltage ramp 360, a portion 230 of the page buffer 220 monitors the memory cells, such as target memory cell $308_T$, to be read for conduction. In the example of FIG. 3, for example, the portion 230 determines whether a current flows in the bit lines 304 coupled to the strings 306 containing the memory cells commonly coupled word line WLN-1 of block $301_1$ that are to be read, in response to the memory cells to be read conducting. For example, portion 230 of the page buffer 220 might determine whether a current flows in bit line $304_2$ coupled to the string 306 containing target memory cell $308_T$ in response to target memory cell $308_T$ conducting.

In the example of FIG. 3, the count from counter 355 might be input into a conversion table 365, while the count is being input to DAC 350. For example, conversion table 365 might be a look-up table. Conversion table 365 might be stored in a static random access memory (SRAM), for example. Conversion table 365 might store a code for each value of the count, such as a code corresponding to a data state of the memory cells. For example, the code might include bit values stored in the memory cells being read, such as the bit values stored in target memory cell $308_T$, and thus the code might correspond to a data state of target memory cell $308_T$.

Conversion table 365 might be selectively coupled to portion 230 of the page buffer 220 through a multiplexer 370, for some embodiments. For example, multiplexer 370 might select one of the outputs $b_1$ to $b_R$ of conversion table 365 in response to receiving an input corresponding to the one of the outputs $b_1$ to $b_R$. Outputs $b_1$ to $b_R$ might respectively correspond to particular bits stored in a memory cell being read, such as target memory cell $308_T$, where the subscript R might correspond to the number of bits per a multilevel cell.

For example, conversion table 365 might output (e.g., latch) a code, selected by an input to the multiplexer 370, into the portion 230 of the page buffer 220 through multiplexer 370 in response to the portion 230 detecting a current flow in a bit line 304, such as bit line $304_2$ coupled to target memory cell $308_T$, and in response to multiplexer receiving an input. For example, the code corresponding to a particular value of the count in conversion table 365 might be output when the voltage in voltage ramp 360, corresponding to that particular value of the count, causes a current flow in a bit line 304.

Figure 4A:
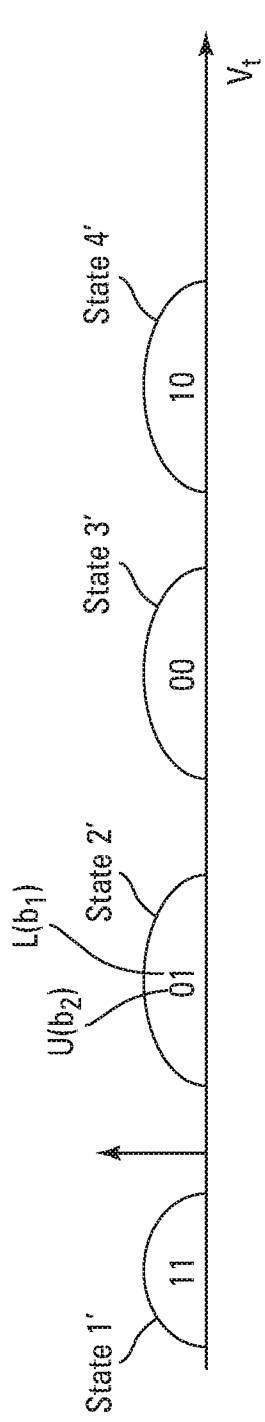
FIG. 4A illustrates threshold voltage ranges and corresponding data states for a two-bit memory cell.
Figure 4B:
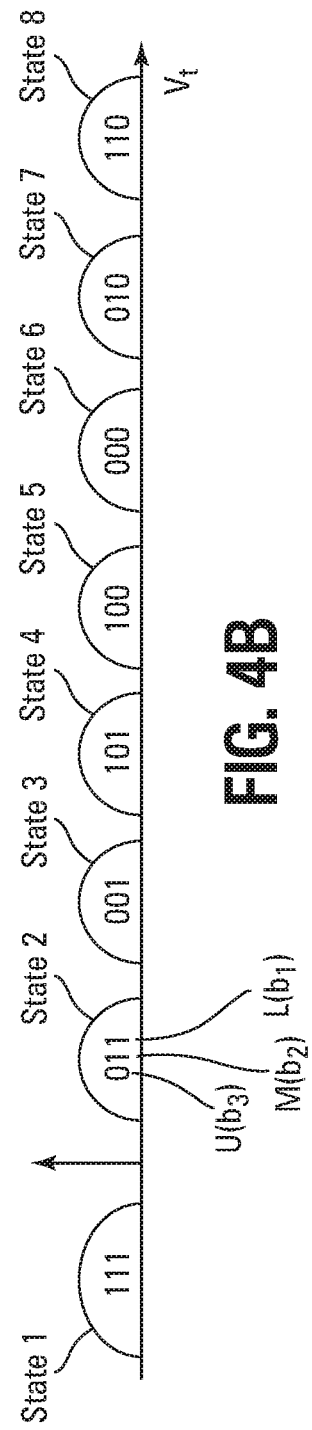
FIG. 4B illustrates threshold voltage ranges and corresponding data states for a three-bit memory cell.

FIGS. 4A and 4B respectively illustrate threshold voltage (Vt) ranges for a memory cell (e.g., a two-bit memory cell) programmed to store two bits and memory cell (e.g., a three-bit memory cell) programmed to store three bits. For example, R=2 in FIG. 4A, and R=3 in FIG. 4B. For example, for the two-bit memory cell in FIG. 4A, conversion table 365 may have outputs $b_1$ and $b_2$ that are selected by corresponding inputs to multiplexer 370. Outputs $b_1$ and $b_2$ might respectively correspond to lower (L) and upper (U) bits of data at a respective one of the data states (e.g., states 1', 2', 3', and 4' in FIG. 4A) of a two-bit memory cell. For example, the upper and lower bits may be respectively referred to as upper- and lower-page bits. Note that two-bit memory cells may be used for edge memory cells, such as the memory cells coupled to word lines WL1 and WLN in FIG. 3.

For the three-bit memory cell in FIG. 4B, conversion table 365 may have outputs $b_1$, $b_2$, and $b_3$ that are selected by corresponding inputs to multiplexer 370, for example. Outputs $b_1$, $b_2$, and $b_3$ might respectively correspond to lower (L), middle (M), and upper (U) bits of data at a respective one of the data states (e.g., states 1, 2, 3, 4, 5, 6, 7, and 8) of a three-bit memory cell. For example, the lower, middle, and upper bits may be respectively referred to as lower-, middle-, and upper-page bits.

Figure 5:
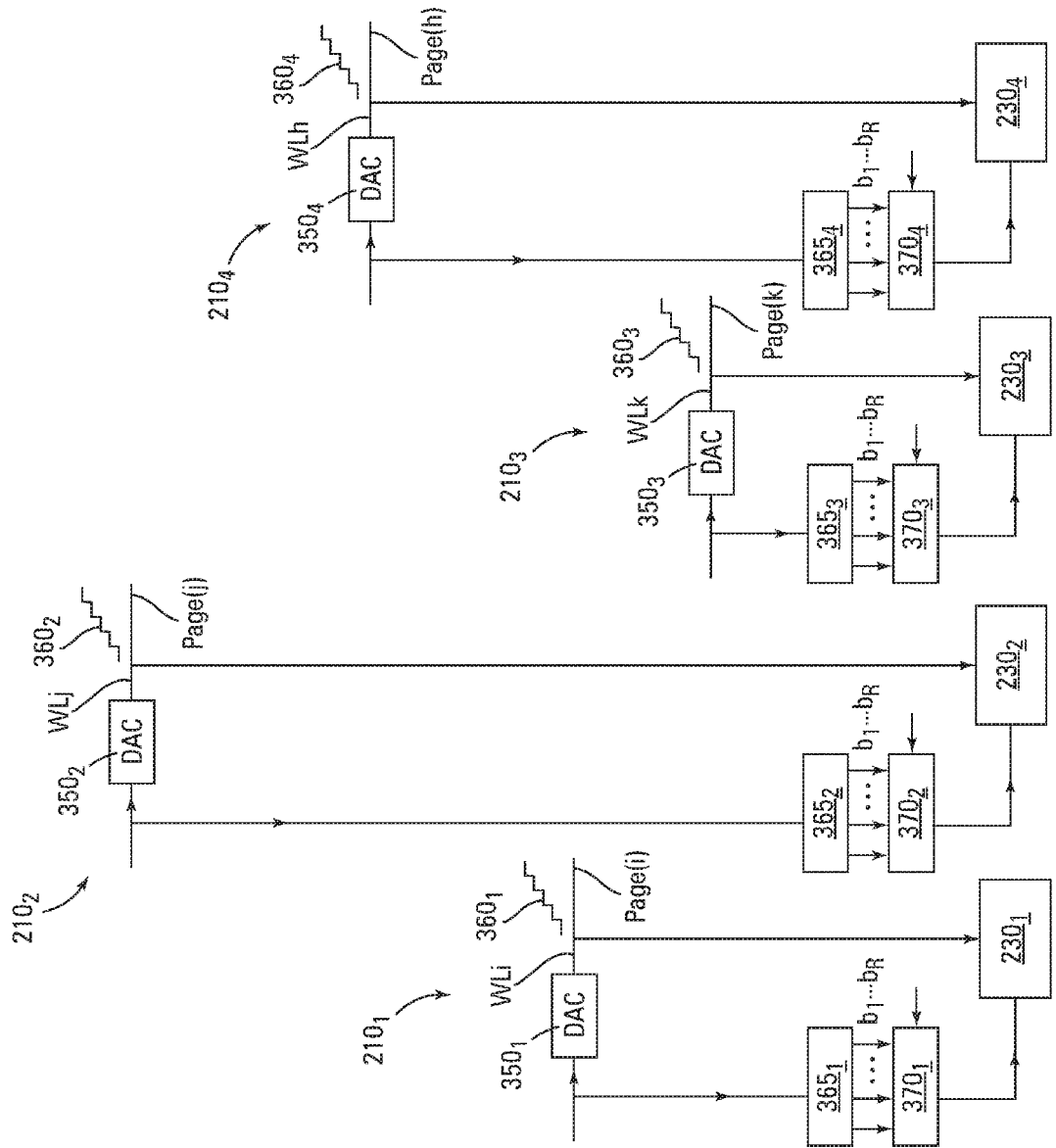
FIG. 5 is a block diagram illustrating components used during a read operation performed on different memory planes, according to another embodiment.

FIG. 5 is a block diagram of portions of memory planes $210_1$, $210_2$, $210_3$, and $210_4$ that are being read concurrently, e.g., in a read time tR. DACs $350_1$, $350_2$, $350_3$, and $350_4$ might be respectively coupled to word lines WLi, WLj, WLk, and WLh that are respectively coupled to memory cells that are being read during read time tR. For some embodiments, DACs $350_1$, $350_2$, $350_3$, and $350_4$ and/or counter 355 might be in control logic 116 in FIG. 1.

Note that addressed page(i), page(j), page(k), and page(h) in FIG. 5 might respectively include the memory cells being read that are coupled to the word lines WLi, WLj, WLk, and WLh. For example, target memory cells targeted for reading, such as target memory cell $308_T$ in FIG. 3, might be respectively coupled to word lines WLi, WLj, WLk, and WLh, so that each of addressed page(i), page(j), page(k), and page(h) might include a respective target memory cell.

Each of word lines WLi, WLj, WLk, and WLh, and thus each of page(i), page(j), page(k), and page(h), might be associated with different one of conversion tables $365_1$, $365_2$, $365_3$, and $365_4$. That is, word lines WLi, WLj, WLk, and WLh, and thus page(i), page(j), page(k), and page(h), might be respectively associated with conversion tables $365_1$, $365_2$, $365_3$, and $365_4$, for example. For some embodiments, conversion tables $365_1$, $365_2$, $365_3$, and $365_4$ might be in control logic 116 in FIG. 1, for example A dedicated conversion table might be selectively coupled to each of portions $230_1$, $230_2$, $230_3$, and $230_4$ of page buffer 220. For example, conversion tables $365_1$, $365_2$, $365_3$, and $365_4$ might be respectively dedicated to portions $230_1$, $230_2$, $230_3$, and $230_4$ and to memory planes $210_1$, $210_2$, $210_3$, and $210_4$. For example, conversion tables $365_1$, $365_2$, $365_3$, and $365_4$ might respectively output codes, that might be the same as or different from each other, selected by multiplexers $370_1$, $370_2$, $370_3$, and $370_4$ to portions $230_1$, $230_2$, $230_3$, and $230_4$ to account for the possibility (e.g., the likelihood) that page(i), page(j), page(k), and page(h) have different page addresses. That is, for some embodiments, conversion table $365_1$ might output codes only to portion $230_1$; conversion table $365_2$ might output codes only to portion $230_2$; conversion table $365_3$ might output codes only to portion $230_3$; and conversion table $365_4$ might output codes only to portion $230_4$. For three-bit memory cells, multiplexers $370_1$, $370_2$, $370_3$, and $370_4$ might respectively select outputs $b_1$, $b_2$, $b_3$, and $b_2$ for output to portions $230_1$, $230_2$, $230_3$, and $230_4$, for example.

The page buffers $370_1$ to $370_4$ might be respectively dedicated to memory portions $230_1$ to $230_4$, for example. For example, multiplexer $370_1$ might only be used for portion $230_1$, multiplexer $370_2$ only for portion $230_2$, multiplexer $370_3$ only for portion $230_3$, and multiplexer $370_4$ only for portion $230_4$.

DACs $350_1$, $350_2$, $350_3$, and $350_4$ might receive an incremented count concurrently during the read time tR, such as from the counter 355 in FIG. 3. In response to the incremented count, DACs $350_1$, $350_2$, $350_3$, and $350_4$ might respectively generate (output) analog voltage ramps $360_1$, $360_2$, $360_3$, and $360_4$ that might be respectively concurrently applied to word lines WLi, WLj, WLk, and WLh during the read time tR. Tables $365_1$, $365_2$, $365_3$, and $365_4$ might receive the incremented count concurrently with DACs $350_1$, $350_2$, $350_3$, and $350_4$ during the read time tR. For example, at least one voltage from analog voltage ramps $360_1$, $360_2$, $360_3$, and $360_4$ might be output concurrently.

When target memory cells coupled to word lines WLi, WLj, WLk, and/or WLh conduct for a voltage corresponding to a particular value of the count, causing a current flow to be detected by portions $230_1$, $230_2$, $230_3$, and/or $230_4$, respectively, a code corresponding to that count in tables $365_1$, $365_2$, $365_3$, and/or $365_4$, respectively, might be selected for output by multiplexers $370_1$, $370_2$, $370_3$, and/or $370_4$, in response to that count, to portions $230_1$, $230_2$, $230_3$, and/or $230_4$, respectively. Note, however, that target memory cells coupled to different ones of word lines WLi, WLj, WLk, and WLh might not conduct for the same value of the count.

For example, at least one of the target memory cells coupled to different ones of word lines WLi, WLj, WLk, and WLh might conduct for a different data state than the remainder of the target memory cells coupled to the different ones of word lines WLi, WLj, WLk, and WLh. For example, a target memory cell coupled to word line WLi might conduct for data state 4 in FIG. 4B or data state 4' in FIG. 4A, while target memory cells respectively coupled to word lines WLj, WLk, and WLh might conduct for data state 2 in FIG. 4B.

In some examples, for three-bit memory cells, for example, outputs $b_1$, $b_2$, $b_3$, and $b_2$ might be respectively selected for output to portions $230_1$, $230_2$, $230_3$, and $230_4$ for a particular value of the count. In other examples, at least one of word lines WLi, WLj, WLk, and WLh, such as word line WLi, might be commonly coupled to two-bit memory cells, while the remaining word lines WLj, WLk, and WLh might be commonly coupled to three-bit memory cells. For such examples, an output might be selected from outputs $b_1$ and $b_2$ of the conversion table for word line WLi for a read operation occurring during the read time tR, while outputs might be selected from outputs $b_1$, $b_2$, and $b_3$ of each of word lines WLj, WLk, and WLh for the read operation occurring during the read time tR.

For devices where a page of data is stored in memory cells coupled to commonly numbered word lines, such as word lines WLC, in memory planes $210_1$, $210_2$, $210_3$, and $210_4$ (FIG. 2) that are read during a single read operation, a single conversion table may be commonly coupled to portions $230_1$, $230_2$, $230_3$, and $230_4$ of conversion table 220. For example, for a particular value of the count, the single conversion table might output the same code to each of portions $230_1$, $230_2$, $230_3$, and $230_4$ concurrently in response to target memory cells coupled to word lines WLC conducting.

Figure 6:
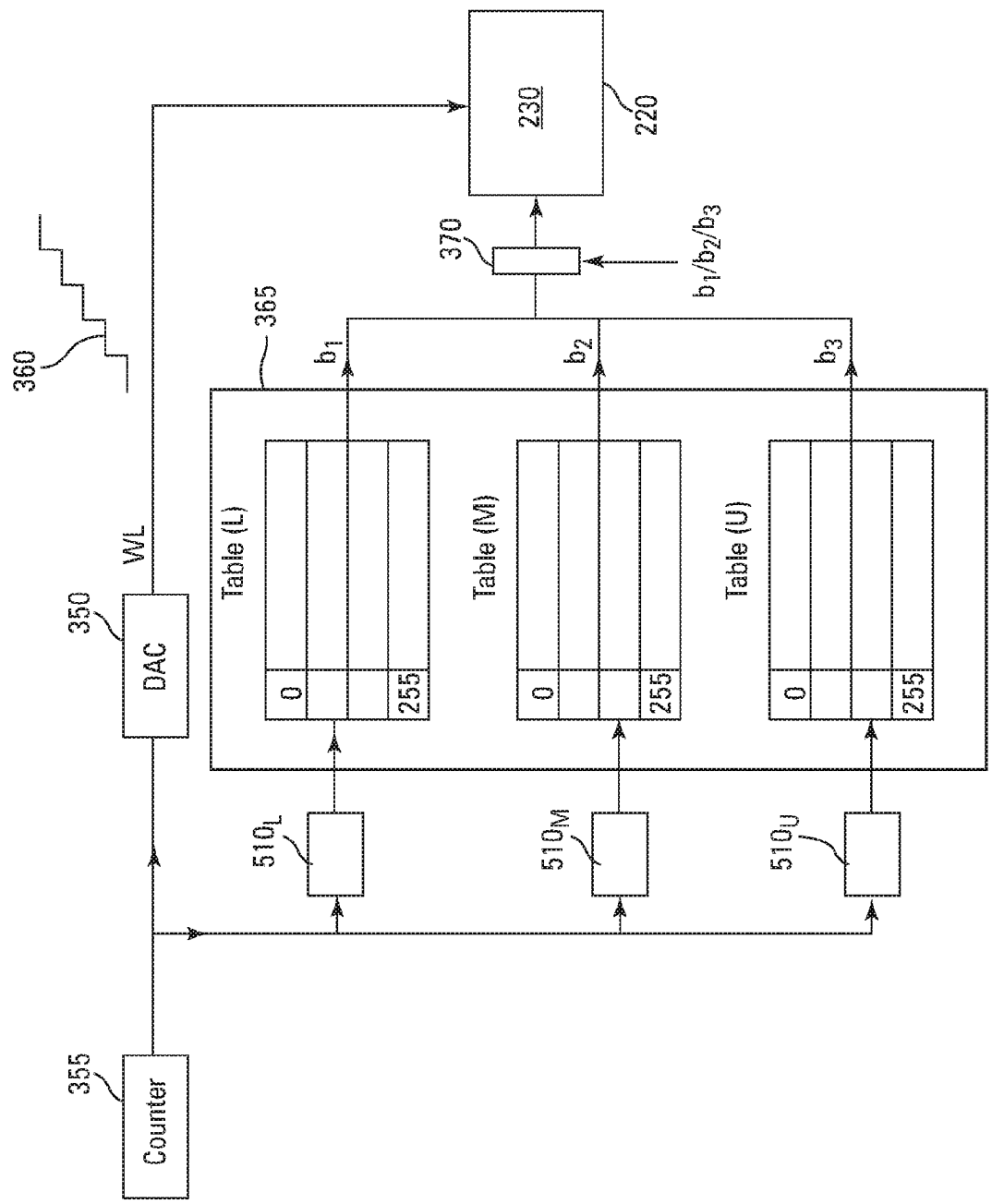
FIG. 6 is a block diagram illustrating a table and other components used during a read operation, according to another embodiment.

FIG. 6 is a block diagram of a conversion table 365 that may be selectively coupled to a respective portion 230 of page buffer 220 through a multiplexer 370. Each of conversion tables $365_1$, $365_2$, $365_3$, and $365_4$ may be configured as shown in FIG. 6 for conversion table 365.

In the example of FIG. 6, conversion table 365 may be for three-bit memory cells. For example, conversion table 365 may have Table(L), Table(M), and Table(U) respectively having outputs $b_1$, $b_2$, and $b_3$ coupled to multiplexer 370. Table(L), Table(M), and Table(U) may respectively store a lower-page code, including a lower-page bit, a middle-page code, including a middle-page bit, and an upper-page code, including an upper-page bit.

Each Table(L), Table(M), and Table(U) might include rows corresponding to values of the count from counter 355. In the example of FIG. 6, Table(L), Table(M), and Table(U) might include rows having row numbers 0 to 255 respectively corresponding to count values of 0 to 255, where each row includes a code corresponding to a respective count value. Note that each count value corresponds to (e.g., represents) an analog voltage in analog voltage ramp 360.

Each row in Table(L), corresponding to a count value, might include a lower-page code, including a lower-page bit (e.g., that may be referred to as a "hard" bit) and other bits, such as compensation bits (e.g., that may be referred to as "soft bits"). For example, the compensation bits might compensate for the effects of memory cells adjacent to a target memory cell on a hard bit being read from the target memory cell. Each row in Table(M), corresponding to a count value, might include a middle-page code, including a middle-page bit and other bits, such as compensation bits. Each row in Table(U), corresponding to a count value, might include an upper-page code, including an upper-page bit and other bits, such as compensation bits.

For the three-bit memory cell example of FIGS. 4B and 6, a memory cell, such as a target memory cell to be read, might store three bits at any of states 1, 2, 3, 4, 5, 6, 7, and 8 in FIG. 4B. For example, the count of 0 to 255 might be divided into eight ranges of 32 counts in each range, and the rows 0 to 255 in Table(L), Table(M), and Table(U) might be divided into eight ranges of 32 rows for each range. For example, each range might correspond to a respective one of the states 1, 2, 3, 4, 5, 6, 7, and 8.

The counts, and thus rows, 0 to 31, 32 to 63, 64 to 95, 96 to 127, 128 to 159, 160 to 191, 192 to 223, and 224 to 255, might respectively correspond to states 1, 2, 3, 4, 5, 6, 7, and 8 in FIG. 4B. For example, codes in rows 0 to 31, 32 to 63, 64 to 95, 96 to 127, 128 to 159, 160 to 191, 192 to 223, and 224 to 255 in Table(L) might respectively include lower-page bits 1, 1, 1, 1, 0, 0, 0, and 0; codes in rows 0 to 31, 32 to 63, 64 to 95, 96 to 127, 128 to 159, 160 to 191, 192 to 223, and 224 to 255 in Table(M) might respectively include middle-page bits 1, 1, 0, 0, 0, 0, 1, and 1; and codes in rows 0 to 31, 32 to 63, 64 to 95, 96 to 127, 128 to 159, 160 to 191, 192 to 223, and 224 to 255 in Table(U) might respectively include upper-page bits 1, 0, 0, 1, 1, 0, 0, and 1.

A target memory cell that conducts response to a voltage on a word line WL produced by a count value that lies in a particular range might store the upper, middle, and lower page bits of the state corresponding to the particular range. For example, if a memory cell conducts in response an analog voltage corresponding to a count of 37 that lies in the range 32 to 63, that memory target cell might store the upper (0), middle (1), and lower (1) page bits of the state 2 in FIG. 4B, corresponding to the range 32 to 63.

The upper (0), middle (1), and lower (1) page bits might be included in the code in row 37 respectively in Table(U), Table(M), and Table(L). The upper (0), middle (1), and lower (1) page bits might be respectively included in the output $b_3$, $b_2$, and $b_1$ respectively of Table(U), Table(M), and Table(L). The upper (0), middle (1), or lower (1) page bit might be output to portion 230 of page buffer 220 in response to multiplexer 370 respectively selecting the output $b_3$, $b_2$, or $b_1$. Note that a code is output from a row in a conversion table having (e.g., identified by) a number that matches the value of the count that represents the analog voltage that causes the memory cells to be read to conduct.

For example, for a read operation performed during a read time tR, the target memory cells conducting in response to a count of 37 that lies in the range 32 to 63 might be coupled to word lines WLi, WLj, WLk, and WLh in FIGS. 2 and 5. The multiplexers $370_1$, $370_2$, $370_3$, and $370_4$ respectively corresponding to word lines WLi, WLj, WLk, and WLh might respectively select outputs $b_3$, $b_2$, $b_1$, and $b_2$ (e.g., that might respectively include the upper (0), middle (1), lower (1), and middle (1) page bits) for output to portions $230_1$, $230_2$, $230_3$, and $230_4$ in FIGS. 2 and 5, for example.

In a read operation, during a read time tR, a DAC 350 might receive an incremented count and might generate (output) an analog voltage ramp 360 that is applied to a word line commonly coupled to one or more memory cells that are to read, such as a target memory cell. For example, for a particular digital value of the incremented count, an analog voltage represented by the particular digital value of the count might be applied to a word line WL, such as each of the word lines WLi, WLj, WLk, and WLh in FIGS. 2 and 5. The particular digital value of the count might also be received at shifters 510, such as shifters $510_L$, $510_M$, and $510_U$ in FIG. 6. In response to receiving the particular digital value of the count, shifters $510_L$, $510_M$, and $510_U$ might respectively select a row in Table(L), Table(M), and Table (U) that corresponds to the particular digital value of the count.

Table(L), Table(M), and Table(U) might respectively include a shifter $510_L$, $510_M$, and $510_U$, for example. Shifters $510_L$, $510_M$, and $510_U$ might respectively correspond to Table(L), Table(M), and Table(U) on a one-to-one basis, for example. Shifters $510_L$, $510_M$, and $510_U$, for example, might be in control logic 116 of memory device 100 in FIG. 1.

If the memory cells that are to be read conduct in response to the analog voltage generated by (e.g., corresponding to) the particular digital value of the count, a multiplexer 370 might select, e.g., in response to a user input to multiplexer 370, either output $b_1$, $b_2$, or $b_3$ and thus either Table(L), Table(M), or Table(U) for output to a portion 230 of the page buffer 220. The code in the row corresponding to the particular digital value of the count may then be output to the portion 230 of the page buffer 220 through multiplexer 370. Note that this may be done for the word lines WLi, WLj, WLk, and WLh (FIGS. 2 and 5), and thus page(i), page(j), page(k), and page(h), respectively of memory planes $210_1$, $210_2$, $210_3$, and $210_4$ concurrently during a single read operation during the read time tR, where the multiplexers $370_1$, $370_2$, $370_3$, and $370_4$ respectively corresponding (e.g., dedicated) to memory planes $210_1$, $210_2$, $210_3$, and $210_4$ might select codes corresponding to the particular value of the count from the same or different ones of Table(L), Table(M), or Table(U).

For two-bit memory cells, such as edge memory cells coupled to word lines WL1 and WLN in FIG. 3, a conversion table 365 might have a Table(L) and a Table(U). For example, Table(M) in FIG. 6 might be omitted for word lines coupled to two-bit memory cells, e.g., for pages of two-bit memory cells, and the output $b_3$ might be changed to output $b_2$. Note that a two-bit memory cell might have four states, such as states 1', 2', 3', and 4', as shown in FIG. 4A. For example, a two-bit memory cell might store two bits at any of states 1', 2', 3', and 4' in FIG. 4A. For a two-bit memory cell, Table(L) and Table(U) might respectively store a lower-page code, including a lower-page bit, and an upper-page code, including an upper-page bit.

Table(L) and Table(U) for two-bit memory cells might include rows 0 to 255 respectively corresponding to count values of 0 to 255, where each row includes a code corresponding to a respective count value. For example, the count of 0 to 255 might be divided into four ranges of 64 counts each, and the rows 0 to 255 in Table(L) and Table(U) might be divided into four ranges of 64 rows each. For example, each range might correspond to a respective one of the states 1', 2', 3', and 4'. The counts, and thus rows, 0 to 63, 64 to 127, 128 to 191, and 192 to 255, might, for example, respectively correspond to states 1', 2', 3', and 4' in FIG. 4A.

For example, if a two-bit target memory cell conducts in response to a count of 69 that lies in the range 64 to 127, that target memory cell might store the upper (0) and lower (1) page bits of the state 2' in FIG. 4A, corresponding to the range 64 to 127. The upper (0) and lower (1) page bits might be included in the code in row 69 respectively in Table(U) and Table(L). The upper (0) and lower (1) page bits might be respectively included in the output $b_2$ and $b_1$ respectively of Table(U) and Table(L). The upper (0) or lower (1) page bit might be output to portion 230 of page buffer 220 in response to multiplexer 370 respectively selecting the output $b_2$ or $b_1$, e.g., in response to a user input.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device, comprising:
   a first digital-to-analog converter configured to convert a first digital value received thereat to a first analog read voltage and to apply the first analog read voltage to a first memory cell in a first memory plane;
   a second digital-to-analog converter configured to convert a second digital value received thereat to a second analog read voltage and to apply the second analog read voltage to a second memory cell in a second memory plane;
   a first page buffer dedicated to the first memory plane and coupled to the first memory cell;
   a second page buffer dedicated to the second memory plane and coupled to the second memory cell;
   a plurality of first tables dedicated to the first page buffer, each of the plurality of first tables comprising a code-containing row identified by the first digital value;
   a plurality of second tables dedicated to the second page buffer, each of the plurality of second tables comprising a code-containing row identified by the second digital value;

a first multiplexer dedicated to the first page buffer and coupled to the first page buffer and the plurality of first tables, the first multiplexer configured to selectively couple one of the plurality of first tables to the first page buffer for output of a first code from the code-containing row, identified by the first digital value, of the one of the plurality of first tables to the first page buffer in response to the first memory cell conducting in response to the first analog read voltage, the first code corresponding to a data state of the first memory cell; and a second multiplexer dedicated to the second page buffer and coupled to the second page buffer and the plurality of second tables, the second multiplexer configured to selectively couple one of the plurality of second tables to the second page buffer for output of a second code from the code-containing row, identified by the second digital value, of the one of the plurality of second tables to the second page buffer in response to the second memory cell conducting in response to the second analog read voltage, the second code corresponding to a data state of the second memory cell;

wherein the first code is to be output from the code-containing row of the one of the plurality of first tables to the first page buffer concurrently with the second code being output from the code-containing row of the one of the plurality of second tables to the second page buffer.

2. The memory device of claim 1, wherein the first memory cell is in a first page of memory cells and the second memory cell is in a second page of memory cells, and wherein the first and second pages of memory cells have different page addresses.

3. The memory device of claim 1, further comprising:
a plurality of first shifters, each first shifter of the plurality of first shifters respectively corresponding one-to-one to the first tables of the plurality of first tables, each first shifter of the plurality of first shifters configured to receive the first digital value concurrently with the first analog-to-digital converter and to select the code-containing row, identified by the first digital value, of a corresponding one of the plurality of first tables; and
a plurality of second shifters, each second shifter of the plurality of second shifters respectively corresponding one-to-one to the second tables of the plurality of second tables, each second shifter of the plurality of second shifters configured to receive the second digital value concurrently with the second analog-to-digital converter and to select the code-containing row, identified by the second digital value, of a corresponding one of the plurality of second tables.

4. The memory device of claim 1, wherein the plurality of first tables comprises a first number of first tables and the plurality of second tables comprises a second number of second tables, wherein the first number is different than the second number.

5. The memory device of claim 1, wherein the first memory cell is programmed to store a different number of bits than the second memory cell.

6. The memory device of claim 1, wherein each first table of the plurality of first tables corresponds to a respective bit of the data state for the first memory cell, and wherein each second table of the plurality of second tables corresponds to a respective bit of the data state for the second memory cell.

7. The memory device of claim 1, wherein the first code comprises a page bit corresponding to the data state for the first memory cell, and wherein the second code comprises a page bit corresponding to the data state for the second memory cell.

8. The memory device of claim 7, wherein the first code further comprises a compensation bit accounting for effects of memory cells adjacent to the first memory cell on the page bit of the first code.

9. The memory device of claim 1, wherein the first digital value and the second digital value are each received from a counter.

10. The memory device of claim 9, wherein the counter is configured to provide a succession of digital values to the first digital-to-analog converter and to the second digital-to-analog converter during a read operation on the memory device.

11. A memory device, comprising:
a first digital-to-analog converter configured to convert a first digital value received thereat to a first analog read voltage and to apply the first analog read voltage to a first memory cell in a first memory plane;
a second digital-to-analog converter configured to convert a second digital value received thereat to a second analog read voltage and to apply the second analog read voltage to a second memory cell in a second memory plane concurrently with applying the first analog read voltage to the first memory cell in the first memory plane;
a first page buffer dedicated to the first memory plane and coupled to the first memory cell;
a second page buffer dedicated to the second memory plane and coupled to the second memory cell;
a plurality of first tables dedicated to the first page buffer, each of the plurality of first tables comprising a code-containing row identified by the first digital value;
a plurality of second tables dedicated to the second page buffer, each of the plurality of second tables comprising a code-containing row identified by the second digital value;
a first multiplexer dedicated to the first page buffer and coupled to the first page buffer and the plurality of first tables, the first multiplexer configured to selectively couple one of the plurality of first tables to the first page buffer for output of a first code from the code-containing row, identified by the first digital value, of the one of the plurality of first tables to the first page buffer in response to the first memory cell conducting in response to the first analog read voltage, the first code corresponding to a data state of the first memory cell; and
a second multiplexer dedicated to the second page buffer and coupled to the second page buffer and the plurality of second tables, the second multiplexer configured to selectively couple one of the plurality of second tables to the second page buffer for output of a second code from the code-containing row, identified by the second digital value, of the one of the plurality of second tables to the second page buffer in response to the second memory cell conducting in response to the second analog read voltage, the second code corresponding to a data state of the second memory cell;
wherein the first code is to be output from the code-containing row of the one of the plurality of first tables to the first page buffer concurrently with the second code being output from the code-containing row of the one of the plurality of second tables to the second page buffer.

12. The memory device of claim 11, wherein the first page buffer is coupled to the first memory cell through a first select transistor, and wherein the second page buffer is coupled to the second memory cell through a second select transistor.

13. The memory device of claim 11, wherein the first digital value and the second digital value are a same digital value.

14. The memory device of claim 11, wherein the first memory cell in the first memory plane and the second memory cell in the second memory plane have different plane addresses.

15. The memory device of claim 14, wherein the first memory cell in the first memory plane and the second memory cell in the second memory plane have different page addresses within a particular block of their respective memory plane.

16. The memory device of claim 15, wherein the first memory cell in the first memory plane and the second memory cell in the second memory plane have a same block address within their respective memory plane.

17. The memory device of claim 15, wherein the first memory cell in the first memory plane and the second memory cell in the second memory plane have different block addresses within their respective memory plane.

18. A memory device, comprising:
a first digital-to-analog converter configured to convert a first digital value received thereat to a first analog read voltage and to apply the first analog read voltage to a first memory cell in a first memory plane;
a second digital-to-analog converter configured to convert a second digital value received thereat to a second analog read voltage and to apply the second analog read voltage to a second memory cell in a second memory plane;
a first page buffer dedicated to the first memory plane and coupled to the first memory cell;
a second page buffer dedicated to the second memory plane and coupled to the second memory cell;
a plurality of first tables dedicated to the first page buffer, each of the plurality of first tables comprising a plurality of code-containing rows, wherein a number of first tables of the plurality of first tables equals a number of page bits of a data state of the first memory cell;
a plurality of second tables dedicated to the second page buffer, each of the plurality of second tables comprising a plurality of code-containing rows, wherein a number of second tables of the plurality of second tables equals a number of page bits of a data state of the second memory cell;
a first multiplexer dedicated to the first page buffer and coupled to the first page buffer and the plurality of first tables, the first multiplexer configured to selectively couple one of the plurality of first tables to the first page buffer for output of a first code from a particular code-containing row, identified by the first digital value, of the one of the plurality of first tables to the first page buffer in response to the first memory cell conducting in response to the first analog read voltage, the first code corresponding to a particular page bit of the data state of the first memory cell; and
a second multiplexer dedicated to the second page buffer and coupled to the second page buffer and the plurality of second tables, the second multiplexer configured to selectively couple one of the plurality of second tables to the second page buffer for output of a second code from a particular code-containing row, identified by the second digital value, of the one of the plurality of second tables to the second page buffer in response to the second memory cell conducting in response to the second analog read voltage, the second code corresponding to a particular page bit of the data state of the second memory cell.

19. The memory device of claim 18, wherein the first code is to be output from the code-containing row of the one of the plurality of first tables to the first page buffer concurrently with the second code being output from the code-containing row of the one of the plurality of second tables to the second page buffer.

20. The memory device of claim 18, wherein each code-containing row of the plurality of code-containing rows of each first table of the plurality of first tables corresponds to a respective data state of a plurality of possible data states for the first memory cell.

21. The memory device of claim 20, wherein each data state of the plurality of possible data states for the first memory cell corresponds to a subset of the plurality of code-containing rows of each first table of the plurality of first tables.

* * * * *